United States Patent [19]

Tanaka

[11] 4,043,112
[45] Aug. 23, 1977

[54] ELECTRONIC TIMEPIECE HAVING A BATTERY VOLTAGE MONITOR

[75] Inventor: Kojiro Tanaka, Yachiyo, Japan
[73] Assignee: Kabushiki Kaisha Daini Seikosha, Japan
[21] Appl. No.: 653,256
[22] Filed: Jan. 28, 1976
[30] Foreign Application Priority Data
  Jan. 29, 1975  Japan ............................ 50-13109[U]
[51] Int. Cl.² ........................ G04B 47/06; G04C 3/00
[52] U.S. Cl. ................................ 58/23 BA; 58/50 R; 58/152 H; 340/248 B; 340/249
[58] Field of Search ............. 58/23 BA, 50 R, 152 H; 340/248 B, 249

[56] References Cited
U.S. PATENT DOCUMENTS

| | | | |
|---|---|---|---|
| 3,608,301 | 9/1971 | Loewengart | 58/152 H X |
| 3,641,545 | 2/1972 | Okada | 340/248 B |
| 3,841,087 | 10/1974 | Kikuchi | 58/152 H |
| 3,898,790 | 8/1975 | Takamune et al. | 58/23 BA |
| 3,949,545 | 4/1976 | Chihara | 58/23 BA |
| 3,962,859 | 6/1976 | Ito | 58/23 BA |
| 3,991,553 | 11/1976 | Bergey et al. | 58/23 BA |

Primary Examiner—Stanley J. Witkowski
Attorney, Agent, or Firm—Robert E. Burns; Emmanuel J. Lobato; Bruce L. Adams

[57] ABSTRACT

In an electronic timepiece including a driving circuit for developing display driving signals, and a time display receptive of the display driving signals for displaying time, a battery voltage level monitor. The battery voltage level monitor comprises a voltage detector operative to detect the voltage of a battery which powers the timepiece, and to develop a detector signal when the battery voltage is less than a certain value. The driving circuit includes a display signal control circuit which is responsive to the setting of a display restoring switch and the detector signal for interrupting the display driving signals applied to the display in response to the detector signal, in order to de-energize the display to indicate that the battery voltage is below the certain level. The display signal control circuit is operable to apply the display driving signals to the display under control of the display restoring switch even in the presence of the detector signals thereby to enable the display of time after a low battery voltage condition has been detected.

3 Claims, 6 Drawing Figures

ELECTRONIC TIMEPIECE HAVING A BATTERY VOLTAGE MONITOR

BACKGROUND OF THE INVENTION

This invention relates to an electronic timepiece having a monitor for warning of the end of the battery life by changing the illumination of at least one part of the timepiece display and being operable for restoring to normal the display from condition warning display.

Generally, the battery powered timepiece has much to recommend it since the winding of a spring and the operation of an automatic winding system are not necessary. However the life of timepiece cells are 2 years maximum, and it is impossible to predict the exact battery life according to the unbalanced condition of the current and battery capacity. Therefore, the battery life is not known until the stop of the timepiece's operation.

However, in case the end of the battery life occurs at a place where it is impossible to exchange the cell, the function as the timepiece is completely lost.

SUMMARY OF THE INVENTION

This invention aims to eliminate the above noted difficulty and insufficiency, and the object of the present invention is to provide means for warning of the end of the battery life by a changed illumination of the one of the display elements or segments when the battery voltage becomes lower than a predetermined voltage. Further object of the present invention is to provide the means for restoring the display illumination to the normal condition from the warning condition by the operation of a switch operable from the exterior of the timepiece.

DESCRIPTION OF THE PREFERRED EMBODIMENT

Figure 1:
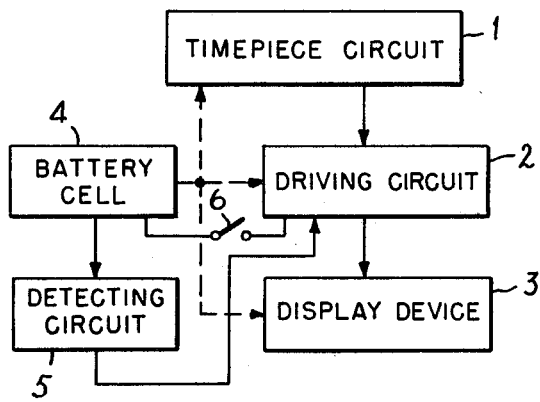
FIG. 1 shows a block diagram of the electronic timepiece according to the present invention.

FIG. 1 shows a block diagram of one example of the electronic timepiece of the present invention in which numeral 1 shows the timepiece circuit composed of an oscillator, divider, counters and decoder for developing signals representative of time, and the output signal from the timepiece circuit is applied to the display device 3 via the driving circuit 2.

Numeral 4 is the battery cell, the power of said cell 4 is applied to the timepiece circuit 1, driving circuit 2 and display device 3 as shown by the dashed lines, and the detecting circuit 5 for detecting the lower level of the battery voltage is connected to the cell 4. The output of the detecting circuit 5 is applied to the driving circuit 2 as a control signal.

Figure 2:
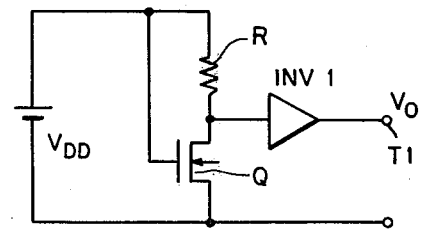
FIG. 2 shows the voltage detecting circuit of FIG. 1.

FIG. 2 shows one embodiment of the detecting circuit 5 composed of the N-channel MOS transistor Q and the inverter INV1. The input voltage of the inverter INV1 is set by the transistor Q and resistor R. When the voltage of the cell is higher than the threshold voltage of the inverter INV1, a high level signal is generated at the output terminal T1. On the other hand, when the voltage of the cell is lower (for example, when the voltage of the cell is less than 1.3 volts, a low level signal is generated at the output terminal T1.

Figure 3:
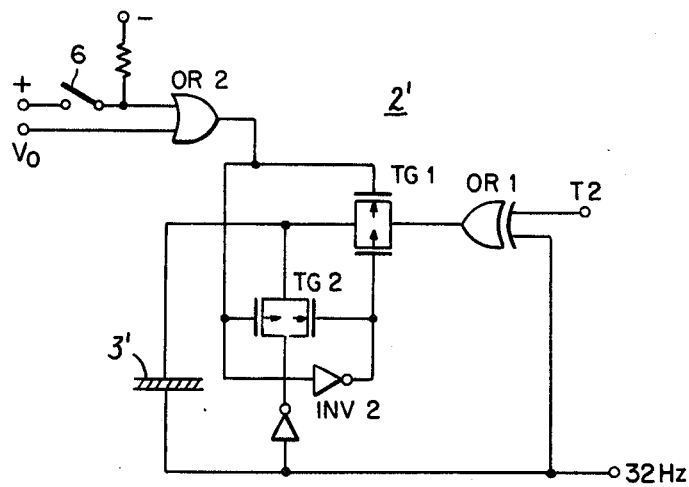
FIG. 3 shows a control circuit of the present invention.

FIG. 3 shows one example of the control circuit 2' controlled by the detecting circuit 5, wherein control circuit 2' is constructed with said driving circuit 2 as one stage of the timepiece.

Namely said control circuit 2' has two transmission gates TG1 and TG2, and the segment control signal for the display segment or digit 3' in the display device 3 is applied to the input terminal of the exclusive OR gate OR1. The output of said transmission gate TG1 is connected to the segment 3 of the display and display of the time is attained by the operation of the display segment 3' being driven by the signal applied via said transmission gate TG1. The output signal of said detecting circuit 5 and the signal developed by the ON-operation of said display restoring switch 6 are applied to the source terminal of said transmission gates TG1 and TG2. When the output of said detecting circuit 5 is high and said switch 6 is ON-position, said transmission gate TG1 is operated whereby the applied 32 Hz signal is applied to the electrode of the display segment 3' to energize the same. On the other hand, when the output of said detecting circuit 5 is low and said switch 6 is OFF-position, the segment and common electrodes of the display segment 3' become to the same polarity by the operation of the transmission gate TG2. Accordingly, the display segment 3' is not illuminated.

Figure 4:
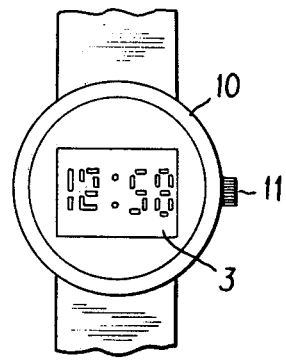
FIG. 4 shows a plan view of a timepiece according to the present invention.

Said display restoring switch 6 cooperates with an additional time amending button 11 of said casing 10 as indicated in FIG. 4, so that it is possible to operate the switch 6 by pushing of said time amending button 11.

Referring now to the operation of the electronic timepiece of the present invention:

When the battery voltage is normal, the transmission gate TG1 is operated to a conductive or ON state by the high level signal of the output of the inverter INV1, and, the segment control signal is applied from the input terminal $T_2$ of the exclusive OR-gate whereby the display segment 3' is driven and time is displayed, for example the time of 12:58.

When the voltage of the battery 4 becomes less than 1.3 volts, the output of the detecting circuit 5 becomes low the transmission gate TG1 is changed to a non-conductive or OFF state and further the transmission gate TG2 is changed to a conductive or ON state by the high level output of said inverter INV2. Therefore, the $32H_2$ signal applied via the exclusive OR-gate OR-1 is stopped, and the electrodes of said display segment 3' are kept at the same polarity by the transmission gate TG-2 whereby the time display of said display device is extinguished. Namely, it is possible to indicate the nearness of the termination of the battery life. At this time, the battery 4 has a substantial ability for driving the timepiece, since there is an allowance of 5 days until the functio of the timepiece is completely stopped from the time of the low voltage warning. Therefore, in the case of warning the display of time until the batery is changed is possible by the ON-operation of the display restoring switch 6. Then the transmission gate TG1 is switched to a conductive state, the transmission gate TG2 is switched to a non-conductive state whereby the inverted 32 Hz signal applied via the exclusive OR-gate OR-1 is applied to the display segment 3', and the time display is attained by the operation of the segment 3'.

The above noted display condition is maintained during the ON-operation of the switch 6.

In the above noted embodiment, the nearness of the battery life termination is acknowledged by the complete erasure of the display portion, however the present invention is not limited only to the above noted embodiment, it is also possible to employ partial erasure of the display, for example only the hour or minute portions.

Figure 5:
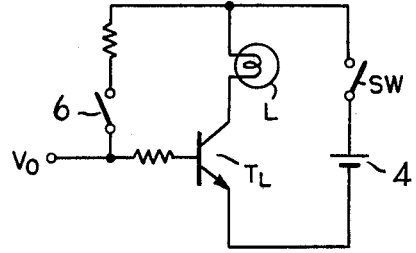
FIG. 5 and FIG. 6 show other embodiments of the control circuit.

FIG. 5 shows the other embodiment of the lamp display means for indicating the batttery condition. The collector and emitter of the transistor TL are connected to the switch SW and the battery 4, the lamp L is connected to the collector of the transistor TL, and the signal from the voltage detecting circuit 5 is applied to the base of the transistor TL.

In the normal condition of the battery voltage, the output of the inverter INV1 is high whereby the transistor TL is maintained conductive. Therefore, it means that there is substantial battery capacity for driving the time piece.

When the battery voltage becomes less than the predetermined voltage, the output of the inverter INV1 becomes to low whereby the transistor TL is maintained non-conductive. Therefore, the lump L is not lighted by the ON-position of the switch SW thereby indicating the nearness of the termination of the battery life.

Figure 6:
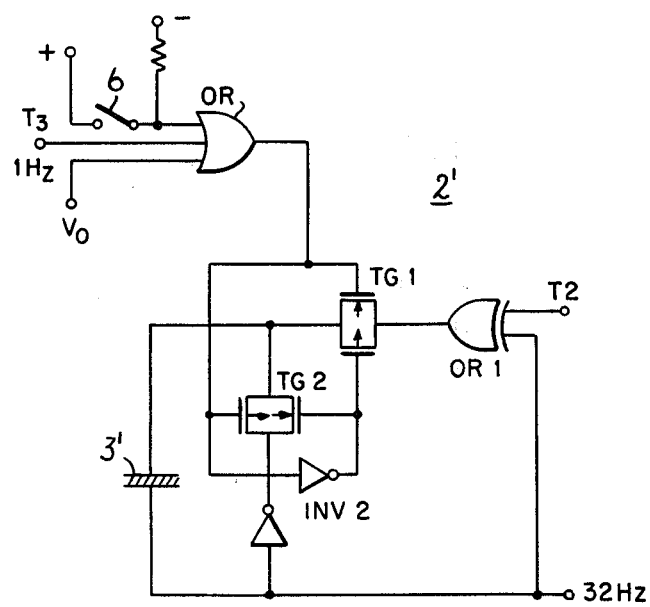

FIG. 6 shows the other embodiment of the present invention which is similar to the circuit shown in FIG. 3, and which includes the signal input terminal T3 for flashing the display and connected to the input side of the OR-gate OR-2. At least one part of the display portion is flashed by the 1HZ pulse signal to indicate the nearness of the termination of the battery life.

According to the present invention, when the voltage of the battery becomes lower than the predetermined level, at least one part of the illumination of the display portion is modified whereby the nearness of the termination of the battery life is indicated so that it is possible to carry the timepiece with an easy mind knowing that low battery voltage will be readily apparent.

It is possible to stop the warning display by the operation of the display restoring switch of the externally operable type thereby restoring the normal display operation.

Further it is possible to display the normal time display after the time of detection of the life of battery. The battery is prolonged by the completely erased display for warning of the nearness of the termination of the battery life.

I claim:

1. In an electronic timepiece of the type including a timepiece circuit for developing time signals representative of time; a driving circuit receptive of the time signals for developing display driving signals in response thereto; a time display receptive of the display driving signals for displaying, in response to the display driving signals, time represented by the time signals; and a battery for energizing the timepiece circuit, the driving circuit, and the display circuit; the improvement which comprises a battery voltage level monitor, for indicating when the voltage of the battery falls below a certain value, and which comprises: a voltage detector operative to detect the voltage of said battery and to develop a detector signal when the battery voltage is less than said certain value, a display restoring switch manually operable to ON and OFF conditions from an exterior of the timepiece, and wherein said driving circuit includes display signal control means responsive to the setting of said display restoring switch and the detector signal for interrupting the display driving signals applied to said display in response to the detector signal in order to de-energize said display and extinguish the time displayed to indicate that the battery voltage is below said certain level, and for applying said display driving signals to said display under control of said display restoring switch even in the presence of said detector signal thereby to enable the display of time after a low battery voltage condition has been detected.

2. In an electronic timepiece according to claim 1, wherein said time display comprises a plurality of display elements each for displaying a numerical digit, wherein said driving circuit develops signals for driving the respective display elements of said time display, and wherein said display signal control means is operative to interrupt the display driving signals applied to one of said display elements.

3. In an electronic timepiece according to claim 1, wherein said display signal control means comprises a transmission gate for applying display driving signals to said display, said transmission gate being responsive to and rendered non-conductive by the detector signal for interrupting the display driving signals applied to said display, means for applying said detector signal to said transmission gate for rendering said transmission gate non-conductive when the battery voltage is below said predetermined level thereby to interrupt said display driving signals, and means for applying a signal under control of said display restoring switch to said transmission gate for rendering said transmission gate conductive even in the presence of said detector signal.

* * * * *